(12) United States Patent
Swier

(10) Patent No.: US 9,650,472 B2
(45) Date of Patent: May 16, 2017

(54) CURABLE COMPOSITIONS OF RESIN-LINEAR ORGANOSILOXANE BLOCK COPOLYMERS

(71) Applicant: Dow Corning Corporation, Midland, MI (US)

(72) Inventor: Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/364,654

(22) PCT Filed: Dec. 14, 2012

(86) PCT No.: PCT/US2012/069701
§ 371 (c)(1),
(2) Date: Jun. 11, 2014

(87) PCT Pub. No.: WO2013/090691
PCT Pub. Date: Jun. 20, 2013

(65) Prior Publication Data
US 2014/0357827 A1 Dec. 4, 2014

Related U.S. Application Data

(60) Provisional application No. 61/570,477, filed on Dec. 14, 2011.

(51) Int. Cl.
| | | |
|---|---|---|
| C08G 77/44 | (2006.01) |
| C09D 183/10 | (2006.01) |
| C08L 83/10 | (2006.01) |
| H01L 23/29 | (2006.01) |

(52) U.S. Cl.
CPC .............. *C08G 77/44* (2013.01); *C08L 83/10* (2013.01); *C09D 183/10* (2013.01); *H01L 23/296* (2013.01); *H01L 2924/0002* (2013.01)

(58) Field of Classification Search
CPC ................................ C08G 77/44; B01J 27/24
USPC .......................................................... 528/21
See application file for complete search history.

(56) References Cited

U.S. PATENT DOCUMENTS

| | | | |
|---|---|---|---|
| 3,294,737 A * | 12/1966 | Krantz | 528/21 |
| 3,436,439 A | 4/1969 | Woods, et al. | |
| 3,639,155 A | 2/1972 | Hartlein et al. | |
| 4,585,670 A | 4/1986 | Liu | |
| 7,825,205 B2 | 11/2010 | Knott et al. | |
| 7,846,581 B2 | 12/2010 | Barrandon et al. | |
| 2007/0104959 A1 | 5/2007 | Asano et al. | |
| 2008/0125542 A1 | 5/2008 | Yamaya et al. | |
| 2009/0176905 A1 * | 7/2009 | Matsuzawa et al. | 522/46 |

FOREIGN PATENT DOCUMENTS

| | | |
|---|---|---|
| CN | 1788054 A | 6/2006 |
| CN | 101205301 A | 6/2008 |
| EP | 1927634 A1 | 6/2008 |
| EP | 2791263 B1 | 8/2016 |
| JP | 49027120 B1 | 7/1974 |
| JP | 50036256 B1 | 11/1975 |
| JP | 60053539 A | 3/1985 |
| JP | 09012864 A | 1/1997 |
| JP | 2006328354 A | 12/2006 |
| JP | 2008133342 A | 6/2008 |
| JP | 2009541531 A | 11/2009 |
| JP | 2011021078 A | 2/2011 |
| WO | WO-2007/149422 A2 | 12/2007 |
| WO | WO-2010142872 A1 | 12/2010 |
| WO | 2012 040367 * | 3/2012 |
| WO | WO-2012/040305 A1 | 3/2012 |
| WO | WO-2012/040367 A1 | 3/2012 |
| WO | WO-2012/040453 A1 | 3/2012 |
| WO | WO-2013/090691 A1 | 6/2013 |

OTHER PUBLICATIONS

"International Application Serial No. PCT/US2012/069701, International Preliminary Report on Patentability mailed Jun. 26, 2014", 9 pgs.
"International Application Serial No. PCT/US2012/069701, International Search Report mailed Apr. 12, 2013", 4 pgs.
"International Application Serial No. PCT/US2012/069701, Written Opinion mailed Apr. 12, 2013", 7 pgs.
"European Application Serial No. 12815889.6, Office Action mailed Jul. 22, 2014", 2 pgs.
"European Application Serial No. 12815889.6, Response filed Jan. 27, 2015 to Office Action mailed Jul. 22, 2014", 10 pgs.
"Chinese Application Serial No. 201280069712.8, Office Action mailed Aug. 28, 2015", (w/ English Translation), 22 pgs.
"Chinese Application Serial No. 201280069712.8, Office Action mailed May 9, 2016", W/ English Translation, 21 pgs.
"Chinese Application Serial No. 201280069712.8, Office Action mailed Nov. 7, 2016", W/ English Translation, 21 pgs.
"Chinese Application Serial No. 201280069712.8, Response filed Feb. 15, 2016 to Office Action mailed Aug. 28, 2015", W/ Machine Translation, 12 pgs.
"Japanese Application Serial No. 2014-547475, Office Action mailed Sep. 16, 2016", W/ English Translation, 13 pgs.
"Chinese Application Serial No. 201280069712.8, Response filed Jan. 23, 2017 to Office Action mailed Nov. 7, 2016", With English Translation of Claims, 16 pgs.
"Japanese Application Serial No. 2014547475, Response filed Feb. 6, 2017 to Office Action mailed Sep. 16, 2016", With English Translation of Claims, 15 pgs.

* cited by examiner

*Primary Examiner* — Kuo-Liang Peng
(74) *Attorney, Agent, or Firm* — Schwegman Lundberg & Woessner, P.A.

(57) ABSTRACT

Curable compositions of "resin-linear" organosiloxane block copolymers comprising a superbase catalyst are disclosed. The addition of a superbase catalyst to compositions of certain resin-linear organosiloxane block copolymers results in curable compositions having faster cure rates, and improved mechanical strength and/or thermal stability over similar compositions without the superbase catalyst.

11 Claims, 1 Drawing Sheet

CURABLE COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Serial No. PCT/US 2012/069701, which was filed Dec. 14, 2012, and published as WO 2013/090691 on Jun. 20, 2013, and which claims the benefit of U.S. Provisional Patent Appl. Ser. No. 61/570,477, filed Dec. 14, 2011, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect photovoltaic cells from environmental factors. Such protective coatings must be optically clear to ensure maximum efficiency of these devices. Furthermore, these protective coatings must also be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

BRIEF SUMMARY OF THE EMBODIMENTS

The inventors have discovered curable compositions of "resin-linear" organosiloxane block copolymers having improved shelf stability. In particular, the curable composition of resin-linear organosiloxane block copolymers of the embodiments described herein have improved stability resulting from the higher temperatures needed to effect final cure of the compositions. In other embodiments, the disclosure provides curable compositions of resin linear organosiloxane block copolymers having accelerated cure rates, improved mechanical strength, and improved thermal stability. In still other embodiments, such "resin-linear" organosiloxane block copolymer, as well as curable compositions and solid compositions derived from these block copolymers offer the significant advantage of being "re-processable" in conjunction with the benefits typically associated with silicones, such as; hydrophobicity, high temperature stability, and moisture/UV resistance. Such "resin-linear" organosiloxane block copolymer, as well as curable compositions and solid compositions derived from these block copolymers, can be processed several times, will cure, and achieve high temperature stability. The melt processability benefits of the "resin-linear" organosiloxane block copolymer, as well as curable compositions and solid compositions derived from these block copolymers, enables the reflow of solid compositions of the organosiloxane block copolymers around device architectures, after an initial coating or solid is formed on the device. This feature is very beneficial to encapsulated various electronic devices. These resin-linear organopolysiloxanes block copolymers also may provide coatings having optical transmission greater than 95%.

Embodiment 1 relates to a curable composition including:
i) an organosiloxane block copolymer including:
  40 to 90 mole percent disiloxy units of the formula $[R^1_2SiO_{2/2}]$,
  10 to 60 mole percent trisiloxy units of the formula $[R^2SiO_{3/2}]$,
  0.5 to 35 mole percent silanol groups [≡SiOH];
wherein:
  $R^1$ is independently a $C_1$ to $C_{30}$ hydrocarbyl,
  $R^2$ is independently a $C_1$ to $C_{20}$ hydrocarbyl;
wherein:
  the disiloxy units $[R^1_2SiO_{2/2}]$ are arranged in linear blocks having an average of from 10 to 400 disiloxy units $[R^1_2SiO_{2/2}]$ per linear block,
  the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and
  the organosiloxane block copolymer has a weight average molecular weight ($M_W$) of at least 20,000 g/mole; and
ii) a superbase catalyst.

Embodiment 2 relates to a curable composition of Embodiment 1, wherein the superbase catalyst includes an organic compound.

Embodiment 3 relates to a curable composition of Embodiment 1, wherein the superbase catalyst includes an amidine compound.

Embodiment 4 relates to a curable composition of Embodiment 1, wherein the superbase catalyst includes:
1,8-Diazabicyclo[5.4.0]undec-7-ene (DBU), (CAS #6674-22-2)
1,5,7-Triazabicyclo[4.4.0]dec-5-ene (TBD), (CAS #5807-14-7)
1,4-Diazabicyclo[2.2.2]octane (DABCO), (CAS #280-57-9)
1,1,3,3-Tetramethylguanidine (TMG), (CAS #80-70-6)
1,5-Diazabicyclo[4.3.0]-5-nonene (DBN), (CAS #3001-72-7),
7-Methyl-1,5,7-triazabicyclo[4.4.0]dec-5-ene (MTBD) (CAS #84030-20-6) or combinations thereof.

Embodiment 5 relates to a curable composition of Embodiment 1, wherein the superbase catalyst includes 1,8-Diazabicyclo[5.4.0]undec-7-ene.

Embodiment 6 relates to a curable composition of Embodiment 1, further including a solvent.

Embodiment 7 relates to a curable composition of Embodiments 1-6, wherein $R^2$ is phenyl.

Embodiment 8 relates to a curable composition of Embodiments 1-7, wherein $R^1$ is methyl or phenyl.

Embodiment 9 relates to a curable composition of Embodiments 1-8, wherein the disiloxy units have the formula $[(CH_3)(C_6H_5)SiO_{2/2}]$.

Embodiment 10 relates to a curable composition of Embodiments 1-9, wherein the disiloxy units have the formula $[(CH_3)_2SiO_{2/2}]$.

Embodiment 11 relates to a curable composition of Embodiments 1-10, wherein the superbase is a silanol condensation enhancing agent.

Embodiment 12 relates to a solid film composition including the curable composition of Embodiments 1-11.

Embodiment 13 relates to a solid film composition of Embodiment 12, wherein the composition has a storage modulus (G') at 120° C. ranging from 10 Pa to 1,000,000 Pa and a loss modulus (G") at 120° C. ranging from 10 Pa to 1,000,000 Pa.

Embodiment 14 relates to a solid film composition of Embodiment 12, wherein the film has a viscosity of at least 1700 Pa·s at 120° C.

Embodiment 15 relates to a solid film composition of Embodiment 12, wherein the film has a tensile strength of at least 1.0 MPa.

Embodiment 16 relates to a solid film composition of Embodiments 12-15, wherein the solid composition has an optical transmittance of at least 95%.

Embodiment 17 relates to a process for preparing a curable composition including:
I) reacting
  a) a linear organosiloxane having the formula:

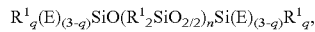

$R^1{}_q(E)_{(3-q)}SiO(R^1{}_2SiO_{2/2})_nSi(E)_{(3-q)}R^1{}_q$, wherein each $R^1$ is independently a $C_1$ to $C_{30}$ hydrocarbyl,
  n is 10 to 400, q is 0, 1, or 2,
  E is a hydrolyzable group containing at least one carbon atom, and
  b) an organosiloxane resin including at least 60 mole % of $[R^2SiO_{3/2}]$ siloxy
    units in its formula, where each $R^2$ is independently a $C_1$ to $C_{20}$ hydrocarbyl;
  in c) an organic solvent;
  to form a resin-linear organosiloxane block copolymer;
    wherein the amounts of a) and b) used in step I are selected to provide the resin-linear organosiloxane block copolymer with 40 to 90 mole % of disiloxy units $[R^1{}_2SiO_{2/2}]$ and 10 to 60 mole % of trisiloxy units $[R^2SiO_{3/2}]$, and
    wherein at least 95 weight percent of the linear organosiloxane added in step I is incorporated into the resin-linear organosiloxane block copolymer;
II) reacting the resin-linear organosiloxane block copolymer from step I) to crosslink the trisiloxy units of the resin-linear organosiloxane block copolymer sufficiently to increase the average molecular weight ($M_W$) of the resin-linear organosiloxane block copolymer by at least 50%;
III) contacting the resin-linear organosiloxane block copolymer from step II) with a superbase catalyst; and
IV) optionally, removing the organic solvent.

Embodiment 18 relates to the process of Embodiment 17, wherein the superbase catalyst includes 1,8-Diazabicyclo[5.4.0]undec-7-ene.

Embodiment 19 relates to a method of reducing the cure temperatures necessary to initiate final cure of a solid curable film composition of a resin linear organopolysiloxane including adding to the composition a superbase catalyst.

Embodiment 20 relates to the method of Embodiment 19, wherein the cure temperature is reduced by at least 10%.

Embodiment 21 relates to a method of increasing the viscosity of a solid curable film composition of a resin linear organopolysiloxane including adding to the composition a superbase catalyst.

Embodiment 22 relates to the method of Embodiment 21, wherein the viscosity of the composition is measured at 120° C.

Embodiment 23 relates to the method of Embodiment 21, wherein the viscosity of the composition is at least 1700 Pa·s at 120° C.

Embodiment 24 relates a method of increasing the tensile strength a solid film composition of a resin linear organopolysiloxane including adding to the composition a superbase catalyst.

Embodiment 25 relates to the method of Embodiment 24, wherein the tensile strength is increased by at least 50% relative to a composition lacking the superbase catalyst.

Embodiment 26 relates to a method of increasing the thermal stability of a solid film composition of a resin linear organopolysiloxane including adding to the composition a superbase catalyst.

DETAILED DESCRIPTION OF THE DRAWINGS

DETAILED DESCRIPTION OF THE EMBODIMENTS

Figure 1:
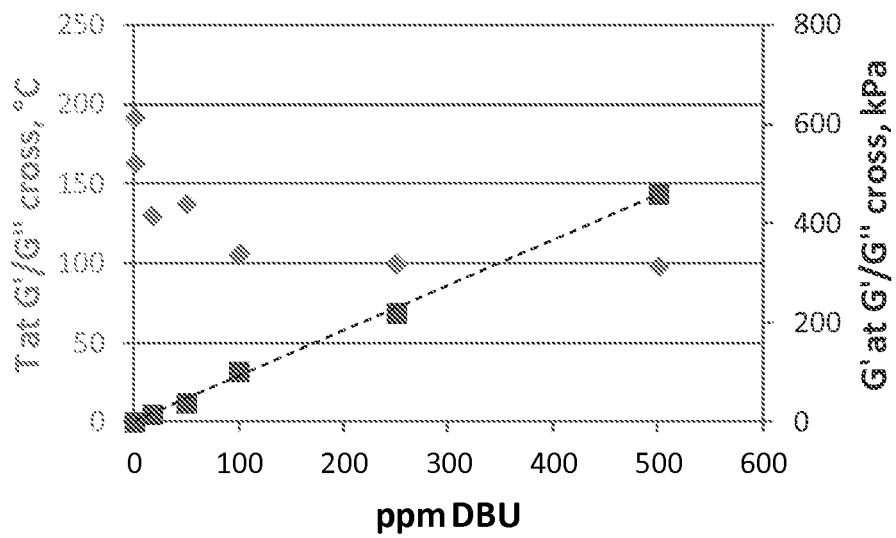
FIG. 1 is an overlay plot of non-isothermal rheology data as a function of DBU concentration.

The disclosure relates to curable compositions of certain organosiloxane block copolymers containing "superbase" catalysts. The present curable compositions have enhanced cure rates, improved mechanical strength, and improved thermal stability over similar compositions without the superbase catalyst.

The curable compositions of the embodiments described herein comprise:
  i) an organosiloxane block copolymer comprising:
    40 to 90 mole percent disiloxy units of the formula $[R^1{}_2SiO_{2/2}]$,
    10 to 60 mole percent trisiloxy units of the formula $[R^2SiO_{3/2}]$,
    0.5 to 35 mole percent silanol groups [≡SiOH];
  wherein:
    $R^1$ is independently a $C_1$ to $C_{30}$ hydrocarbyl,
    $R^2$ is independently a $C_1$ to $C_{20}$ hydrocarbyl,
  wherein:
    the disiloxy units $[R^1{}_2SiO_{2/2}]$ are arranged in linear blocks having an average of from 10 to 400 disiloxy units $[R^1{}_2SiO_{2/2}]$ per linear block,
    the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
    the organosiloxane block copolymer has an average molecular weight ($M_W$) of at least 20,000 g/mole; and
  ii) a superbase catalyst.

i) The Organosiloxane Block Copolymer

The organosiloxane block copolymers comprise:
  40 to 90 mole percent disiloxy units of the formula $[R^1{}_2SiO_{2/2}]$,
  10 to 60 mole percent trisiloxy units of the formula $[R^2SiO_{3/2}]$,
  0.5 to 35 mole percent silanol groups [≡SiOH];
  wherein:
    $R^1$ is independently a $C_1$ to $C_{30}$ hydrocarbyl,
    $R^2$ is independently a $C_1$ to $C_{20}$ hydrocarbyl;
  wherein:
    the disiloxy units $[R^1{}_2SiO_{2/2}]$ are arranged in linear blocks having an average of from 10 to 400 disiloxy units $[R^1{}_2SiO_{2/2}]$ per linear block,
    the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and the organosiloxane block copolymer has a molecular weight of at least 20,000 g/mole.

The organopolysiloxanes of the embodiments described herein as "resin-linear" organosiloxane block copolymers. Organopolysiloxanes are polymers containing siloxy units independently selected from ($R_3SiO_{1/2}$), ($R_2SiO_{2/2}$), ($RSiO_{3/2}$), or ($SiO_{4/2}$) siloxy units, where R may be any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes typically contain mostly D, or ($R_2SiO_{2/2}$) siloxy units, which results in polydiorganosiloxanes that are fluids of varying viscosities, depending on the "degree of polymerization" or DP as indicated by the number of D units in the polydiorganosiloxane. "Linear" organopolysiloxanes typically have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin". Increasing the amount of T or Q siloxy units in an organopolysiloxane typically results in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., [$R^1_2SiO_{2/2}$] units) are primarily bonded together to form polymeric chains having, in some embodiments, an average of from 10 to 400 D units (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks".

The T units (i.e., [$R^2SiO_{3/2}$]) are primarily bonded to each other to form branched polymeric chains, which are referred to as "non-linear blocks". In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units [$R^1_2SiO_{2/2}$] are arranged in linear blocks having an average of from 10 to 400 disiloxy units [$R^1_2SiO_{2/2}$] per linear block (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units [$R^2SiO_{3/2}$] are arranged in non-linear blocks having a molecular weight of at least 500 g/mole and at least 30% of the non-linear blocks are crosslinked with each other.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The organosiloxane block copolymers (e.g., those comprising 40 to 90 mole percent disiloxy units of the formula [$R^1_2SiO_{2/2}$] and 10 to 60 mole percent trisiloxy units of the formula [$R^2SiO_{3/2}$]) may be represented by the formula $[R^1{}_2SiO_{2/2}]_a[R^2SiO_{3/2}]_b$ where the subscripts a and b represent the mole fractions of the siloxy units in the copolymer, a may vary from 0.4 to 0.9,
alternatively from 0.5 to 0.9,
alternatively from 0.6 to 0.9,
b may vary from 0.1 to 0.6,
alternatively from 0.1 to 0.5,
alternatively from 0.1 to 0.4,
$R^1$ is independently a $C_1$ to $C_{30}$ hydrocarbyl,
$R^2$ is independently a $C_1$ to $C_{10}$ hydrocarbyl.

In some embodiments, the organosiloxane block copolymers of the embodiments described herein comprise 40 to 90 mole percent disiloxy units of the formula $[R^1{}_2SiO_{2/2}]$, e.g., 50 to 90 mole percent disiloxy units of the formula $[R^1{}_2SiO_{2/2}]$; 60 to 90 mole percent disiloxy units of the formula $[R^1{}_2SiO_{2/2}]$; 65 to 90 mole percent disiloxy units of the formula $[R^1{}_2SiO_{2/2}]$; 70 to 90 mole percent disiloxy units of the formula $[R^1{}_2SiO_{2/2}]$; or 80 to 90 mole percent disiloxy units of the formula $[R^1{}_2SiO_{2/2}]$; 40 to 80 mole percent disiloxy units of the formula $[R^1{}_2SiO_{2/2}]$; 40 to 70 mole percent disiloxy units of the formula $[R^1{}_2SiO_{2/2}]$; 40 to 60 mole percent disiloxy units of the formula $[R^1{}_2SiO_{2/2}]$; 40 to 50 mole percent disiloxy units of the formula $[R^1{}_2SiO_{2/2}]$; 50 to 80 mole percent disiloxy units of the formula $[R^1{}_2SiO_{2/2}]$; 50 to 70 mole percent disiloxy units of the formula $[R^1{}_2SiO_{2/2}]$; 50 to 60 mole percent disiloxy units of the formula $[R^1{}_2SiO_{2/2}]$; 60 to 80 mole percent disiloxy units of the formula $[R^1{}_2SiO_{2/2}]$; 60 to 70 mole percent disiloxy units of the formula $[R^1{}_2SiO_{2/2}]$; or 70 to 80 mole percent disiloxy units of the formula $[R^1{}_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$. It should be understood that the organosiloxane block copolymers of the embodiments described herein may contain additional siloxy units, such as M siloxy units, Q siloxy units, other unique D or T siloxy units (for example having organic groups other than $R^1$ or $R^2$), provided that the organosiloxane block copolymer contains the mole fractions of the disiloxy and trisiloxy units as described above. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1{}_2SiO_{2/2}]$ and trisiloxy units of the formula $[R^2SiO_{3/2}]$, while also containing 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent), where $R^1$ and $R^2$ are as defined above. Thus, in this embodiment, the sum of a+b (when using mole fractions to represent the amount of disiloxy and trisiloxy units in the copolymer) is greater than 0.95, alternatively greater than 0.98.

In some embodiments, the resin-linear organosiloxane block copolymers also contain silanol groups (≡SiOH). The amount of silanol groups present on the organosiloxane block copolymer may vary from 0.5 to 35 mole percent silanol groups [≡SiOH],
alternatively from 2 to 32 mole percent silanol groups [≡SiOH],
alternatively from 8 to 22 mole percent silanol groups [≡SiOH].

The silanol groups may be present on any siloxy units within the organosiloxane block copolymer. The amount described above represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups will reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

$R^1$ in the above disiloxy unit formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls, where the halogen may be chlorine, fluorine, bromine or combinations thereof. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

Each $R^2$ in the above trisiloxy unit formula is independently a $C_1$ to $C_{20}$ hydrocarbyl. As used herein, hydrocarbyl also includes halogen substituted hydrocarbyls, where the halogen may be chlorine, fluorine, bromine or combinations thereof. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The formula $[R^1{}_2SiO_{2/2}]_a[R^2SiO_{3/2}]_b$, and related formulae using mole fractions, as used herein to describe the organosiloxane block copolymers, does not indicate structural ordering of the disiloxy $[R^1{}_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described above via the subscripts a and b. The mole fractions of the various siloxy units in the present organosiloxane block copolymers, as well as the silanol content, may be readily determined by $^{29}$Si NMR techniques, as detailed in the Examples.

The organosiloxane block copolymers of the embodiments described herein have a weight average molecular weight ($M_W$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight ($M_W$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. The average molecular weight may be readily determined using Gel Permeation Chromatography (GPC) techniques, such as those described in the Examples. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole.

In some embodiments, the structural ordering of the disiloxy and trisiloxy units may be further described as follows: the disiloxy units [$R^1_2SiO_{2/2}$] are arranged in linear blocks having an average of from 10 to 400 disiloxy units [$R^1_2SiO_{2/2}$] per linear block, and the trisiloxy units [$R^2SiO_{3/2}$] are arranged in non-linear blocks having a molecular weight of at least 500 g/mole. Each linear block is linked to at least one non-linear block in the block copolymer. Furthermore, at least 30% of the non-linear blocks are crosslinked with each other, alternatively at least at 40% of the non-linear blocks are crosslinked with each other, alternatively at least at 50% of the non-linear blocks are crosslinked with each other.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers, as described below. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein.

Alternatively, certain compounds may be added during the preparation of the block copolymer to specifically crosslink the non-resin blocks. These crosslinking compounds may include an organosilane having the formula $R^5_qSiX_{4-q}$, which is added during the formation of the block copolymer (step II as discussed below), where $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be an oximo, acetoxy, halogen atom, hydroxyl (OH), or an alkoxy group.

In one embodiment, the organosilane having the formula $R^5_qSiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

Other suitable, non-limiting organosilanes useful as crosslinkers include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime)silane.

The crosslinks within the block copolymer will primarily be siloxane bonds, $\equiv$Si—O—Si$\equiv$, resulting from the condensation of silanol groups, as discussed above.

The amount of crosslinking in the block copolymer may be estimated by determining the average molecular weight of the block copolymer, such as with GPC techniques. Typically, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

The curable compositions of the embodiments described herein may further comprise an organic solvent. The organic solvent typically is an aromatic solvent, such as benzene, toluene, or xylene.

The curable compositions of the embodiments described herein may further contain an organosiloxane resin (e.g., free resin that is not part of the block copolymer). The organosiloxane resin present in these compositions typically will be the organosiloxane resin used to prepare the organosiloxane block copolymer. Thus, the organosiloxane resin may comprise at least 60 mole % of $[R^2SiO_{3/2}]$ siloxy units in its formula (e.g., at least 70 mole % of $[R^2SiO_{3/2}]$ siloxy units, at least 80 mole % of $[R^2SiO_{3/2}]$ siloxy units, at least 90 mole % of $[R^2SiO_{3/2}]$ siloxy units, or 100 mole % of $[R^2SiO_{3/2}]$ siloxy units; or 60-100 mole % $[R^2SiO_{3/2}]$ siloxy units, 60-90 mole % $[R^2SiO_{3/2}]$ siloxy units or 70-80 mole % $[R^2SiO_{3/2}]$ siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

The organosiloxane block copolymer of the embodiments described herein may be prepared by the methods known in the art, including the methods disclosed in Published PCT Application Nos. WO2012/040302 and WO2012/040305, which are incorporated herein by reference in their entirety.

ii) The Superbase Catalyst

The present resin-linear organosiloxane block copolymers compositions also contain a superbase catalyst. The term "superbase" and "superbase catalyst" are used herein interchangeably.

The term "superbase" is used herein refers to compounds having a very high basicity, such as lithium diisopropylamide. The term "superbase" also encompasses bases resulting from a mixing of two (or more) bases leading to new basic species possessing inherent new properties. The term "superbase" does not necessarily mean a base that is thermodynamically and/or kinetically stronger than another. Instead, in some embodiments, it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases.

Organic superbases include, but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound.

In some embodiments, the term "superbase" refers to organic superbases having at least two nitrogen atoms and a $pK_b$ of from about 0.5 to about 11, as measured in water. For example, the $pK_b$ is from about 0.5 to about 10, from about 1 to about 5, from about 6 to about 11, from about 3 to about 5, from about 0.5 to about 3 or from about 2 to about 5, as measured in water. In terms of $pK_a$, in some embodiments, superbases have a $pK_a$ of from about 3 to about 13.5, as measured in water. For example, the $pK_a$ is from about 5 to about 10, from about 5 to about 10, from about 8 to about 13.5, from about 6 to about 8, from about 10 to about 12 or from about 9 to about 12, as measured in water. For example, 1,4-diazabicyclo[2.2.2]octane, also known as DABCO, has a pKa of 2.97 and 8.82 (since it contains two nitrogens); and 1,8-diazabicyclo[5.4.0]undec-7-ene, also known as DBU, has a pKa of about 12. See, e.g., http://evans.harvard.edu/pdf/evans_pka_table.pdf.

Organometallic superbases include, but are not limited to, organolithium and organomagnesium (Grignard reagent) compounds. In some embodiments, the organometallic superbases are hindered to the extent necessary to make them non-nucleophilic.

Superbases also include mixtures of organic, organometallic, and/or inorganic superbases. A non-limited example of such mixed superbases is the Schlosser base (or Lochmann-Schlosser base), which is the combination of n-butyllithium and potassium tert-butoxide. The combination of n-butyllithium and potassium tert-butoxide form a mixed aggregate of greater reactivity than either reagent alone and with distinctly different properties in comparison to tert-butylpotassium.

Inorganic superbases include salt-like compounds with small, highly charged anions. Non-limiting examples of inorganic superbases include lithium nitride and alkali- and alkali earth metal hydrides including potassium hydride and sodium hydride. Such species are insoluble in all solvents owing to the strong cation-anion interactions, but the surfaces of these materials are highly reactive and slurries can be used.

In certain embodiments of the present invention, the superbase catalyst is an organic superbase, such as any of the organic superbases as described above or known in the art.

In a further embodiment, the superbase catalyst comprises:

1,8-Diazabicyclo[5.4.0]undec-7-ene (DBU), (CAS #6674-22-2)
1,5,7-Triazabicyclo[4.4.0]dec-5-ene (TBD), (CAS #5807-14-7)
1,4-Diazabicyclo[2.2.2]octane (DABCO), (CAS #280-57-9)
1,1,3,3-Tetramethylguanidine (TMG), (CAS #80-70-6)
1,5-Diazabicyclo[4.3.0]-5-nonene (DBN), (CAS #3001-72-7)
7-Methyl-1,5,7-triazabicyclo[4.4.0]dec-5-ene (MTBD) (CAS #84030-20-6)
or combinations thereof.

The structures for each of these are shown below:

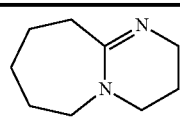
DBU

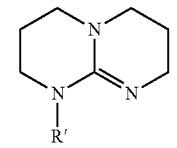
TBD (when R' = H)
MTBD (when R' = CH$_3$)

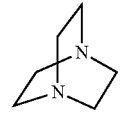
DABCO

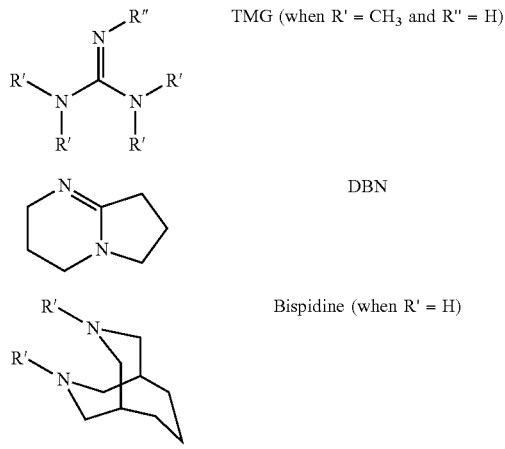

TMG (when R' = CH₃ and R" = H)

DBN

Bispidine (when R' = H)

where each R' is the same or different and is hydrogen or $C_1$-$C_5$ alkyl; and R" is hydrogen or $C_1$-$C_5$ alkyl. As used herein, the term "$C_1$-$C_5$ alkyl" refers broadly to a straight or branched chain saturated hydrocarbon radical. Examples of alkyl groups include, but are not limited to, straight chained alkyl groups including methyl, ethyl, n-propyl, n-butyl; and branched alkyl groups including isopropyl, tert-butyl, isoamyl, neopentyl, and the like. In some embodiments, the hydrocarbon radical is methyl.

The amount of the superbase catalyst in the present curable compositions may vary and is not limiting. Typically, the amount added is a catalytically effective amount, which may vary depending on the superbase selected, as well as the concentration of residual silanol groups in the linear-resin copolymer composition, especially the amount of residual silanol groups on the resin components, and particularly the silanol amount on the "free resin" components in the composition. The amount of superbase catalyst is typically measured in parts per million (ppm) in the curable composition. In particular, the catalyst level is calculated in regard to copolymer solids. The amount of superbase catalyst added to the curable compositions may range from 0.1 to 1,000 ppm, alternatively from 1 to 500 ppm, or alternatively from 10 to 100 ppm, as based on the resin-linear block copolymer content (by weight) present in the curable compositions. For convenience for measuring and adding to the present compositions, the superbase catalyst may be diluted in an organic solvent before adding to the curable compositions. Typically, the superbase in diluted in the same organic solvent as used in the curable compositions.

In some embodiments, the superbase, in its broadest sense, may be considered a silanol condensation enhancing agent and may act as a condensation catalyst. In some embodiments, the silanol condensation enhancing agent may substantially reside in the phase separated resin rich phase and enhances silanol condensation in that phase, thereby reducing the mole % of reactive silanol groups in that phase. While not wishing to be bound by theory, it is believed that the superbase is thought to interact very strongly with acidic SiOH groups of the resin residing in the phase separated resin rich phase. In some embodiments, the silanol condensation enhancing agent will be more likely to reside in the phase separated resin rich phase when the silanol condensation enhancing agent is more compatible (e.g., soluble) with that phase than, e.g., in the organosiloxane block copolymer-rich phase, and less likely to reside in the phase separated resin rich phase when the silanol condensation enhancing agent is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the stabilizer were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the stabilizer were not present.

The present disclosure further provides curable compositions comprising:
  a) the organosiloxane block copolymers as described above in combination with the superbase as described above, and
  b) an organic solvent.

In some embodiments, the organic solvent is an aromatic solvent, such as benzene, toluene, or xylene.

In one embodiment, the curable compositions may further contain an organosiloxane resin (e.g., free resin that is not part of the block copolymer). The organosiloxane resin present in these compositions is, in some embodiments, the same organosiloxane resin used to prepare the organosiloxane block copolymer. Thus, the organosiloxane resin may comprise at least 60 mole % of [$R^2SiO_{3/2}$] siloxy units in its formula (e.g., at least 70 mole % of [$R^2SiO_{3/2}$] siloxy units or at least 80 mole % of [$R^2SiO_{3/2}$] siloxy units; or 60-70 mole % [$R^2SiO_{3/2}$] siloxy units, 60-80 mole % [$R^2SiO_{3/2}$] siloxy units or 70-80 mole % [$R^2SiO_{3/2}$] siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

The amount of the organosiloxane block copolymers, organic solvent, and optional organosiloxane resin in the present curable composition may vary. The curable composition of the present disclosure may contain:
  40 to 80 weight % of the organosiloxane block copolymer as described above (e.g., 40 to 70 weight %, 40 to 60 weight %, 40 to 50 weight %);
  10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight %; and
  5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %).
Such that the sum of the weight % of these components does not exceed 100%. In one embodiment, the curable compositions consist essentially of the organosiloxane block copolymer as described above, the organic solvent, and the organosiloxane resin. In this embodiment, the weight % of these components sum to 100%, or nearly 100%.

In yet another embodiment, the curable compositions contain a cure catalyst. In some embodiments, the cure catalyst is used in addition to the superbase catalyst. The cure catalyst may be selected from any catalyst known in the art to affect condensation cure of organosiloxanes, such as various tin or titanium catalysts. Condensation catalyst can be any condensation catalyst typically used to promote condensation of silicon bonded hydroxy (=silanol) groups to form Si—O—Si linkages. Examples include, but are not limited to, amines, complexes of lead, tin, titanium, zinc, and iron.

The organosiloxane block copolymers and curable compositions containing the organosiloxane block copolymer may be prepared by the methods as described further below. Representative examples of their preparation are also detailed in the Examples section below.

Solid compositions containing the resin-linear organosiloxane block copolymers may be prepared by removing the solvent from the curable organosiloxane block copolymer compositions as described above. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, will accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is believed that the structural ordering of the disiloxy and trisiloxy units in the organosiloxane block copolymer as described above may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

The present disclosure further relates to solid forms of the aforementioned organosiloxane block copolymers and solid compositions derived from the curable compositions described above comprising the organosiloxane block copolymers. Thus, the present disclosure provides organosiloxane block copolymers comprising:

40 to 90 mole percent disiloxy units of the formula $[R^1_2SiO_{2/2}]$, 10 to 60 mole percent trisiloxy units of the formula $[R^2SiO_{3/2}]$, 0.5 to 25 mole percent silanol groups [≡SiOH];

wherein:
$R^1$ is independently a $C_1$ to $C_{30}$ hydrocarbyl,
$R^2$ is independently a $C_1$ to $C_{20}$ hydrocarbyl;

wherein:
the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, at least 30% of the non-linear blocks are crosslinked with each other and are predominately aggregated together in nano-domains, each linear block is linked to at least one non-linear block; and the organosiloxane block copolymer has a weight average molecular weight of at least 20,000 g/mole, and is a solid at 25° C.

In some embodiments, the organosiloxane block copolymers contained in the solid forms and solid compositions comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers contained in the solid forms and solid compositions comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

In some embodiments, the organosiloxane block copolymers contained in the solid forms and solid compositions comprise 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent).

In some embodiments, the disiloxy units $[R^1_2SiO_{2/2}]$ in the organosiloxane block copolymers contained in the solid forms and solid compositions are arranged in linear blocks having an average of 10 to 400 disiloxy units, e.g., about 10 to about 400 disiloxy units; about 10 to about 300 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units;

about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units).

In some embodiments, the non-linear blocks in the organosiloxane block copolymers contained in the solid forms and solid compositions have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to about 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks in the organosiloxane block copolymers contained in the solid forms and solid compositions are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are cross-linked with each other. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

In some embodiments, the organosiloxane block copolymers contained in the solid forms and solid compositions have a weight average molecular weight ($M_W$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers contained in the solid forms and solid compositions have a weight average molecular weight ($M_W$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority of the non-linear blocks of the organosiloxane block copolymer are found in certain regions of the solid composition, described herein as "nano-domains". As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped.

In a further embodiment, the solid organosiloxane block copolymers as described above contain a first phase and an incompatible second phase, the first phase containing predominately the disiloxy units $[R^1_2SiO_{2/2}]$ as defined above, the second phase containing predominately the trisiloxy units $[R^2SiO_{3/2}]$ as defined above, the non-linear blocks being sufficiently aggregated into nano-domains which are incompatible with the first phase.

When solid compositions are formed from the curable compositions of the organosiloxane block copolymer, which also contain an organosiloxane resin, as described above, the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

The advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer the significant advantage of being "re-processable" in conjunction with the benefits typically associated with silicones, such as; hydrophobicity, high temperature stability, moisture/UV resistance.

In one embodiment, the solid compositions of the organosiloxane block copolymers may be considered as "melt processable". In this embodiment, the solid compositions, such as a coating formed from a film of a solution containing the organosiloxane block copolymers, exhibit fluid behavior at elevated temperatures, that is upon "melting". The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta as a function of temperature storage using commercially available instruments. For example, a commercial rheometer (such as TA Instruments' ARES-RDA—with 2KSTD standard flexular pivot spring transducer, with forced convection oven) may be used to measure the storage modulus (G'), loss modulus (G") and tan delta as a function of temperature. Test specimens (typically 8 mm wide, 1 mm thick) may be loaded in between parallel plates and measured using small strain oscillatory rheology while ramping the temperature in a range from 25° C. to 300° C. at 2° C./min (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). Typically, the FLOW of the solid compositions will also correlate to the glass transition temperature of the non-linear segments (i.e., the resin component) in the organosiloxane block copolymer.

In some embodiments, the time to reach tan delta=1 from a value higher than 1 is from about 3 to about 60 minutes at 150° C., e.g., from about 3 to about 5 minutes at 150° C., from about 10 to about 15 minutes at 150° C., from about 10 to about 12 minutes at 150° C., from about 8 to about 10 minutes at 150° C. or from about 30 minutes to about 60 minutes at 150° C. In other embodiments, the tan delta=1 is from about 3 to about 60 seconds at 150° C., e.g., from about 3 to about 30 seconds at 150° C., from about 10 to about 45 seconds at 150° C., from about 5 to about 50 seconds at 150° C., from about 10 to about 30 seconds at 150° C. or from about 30 seconds to about 60 seconds at 150° C. In still other embodiments, the tan delta=1 is from about 5 to about 1200 seconds at 120° C., e.g., from about 20 to about 60 seconds at 120° C., from about 20 to about 600 seconds at 120° C., from about 60 to about 1200 seconds at 120° C., from about 5 to about 100 seconds at 120° C., from about 10 to about 60 seconds at 120° C. or from about 30 seconds to about 60 seconds at 120° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable". In this embodiment, the solid compositions, such as a coating formed from a film of a solution containing the organosiloxane block copolymers, may undergo further physical property changes by further curing the block copolymer. As discussed above, the present organosiloxane block copolymers contain a certain amount of silanol groups. It is believed that the presence of these silanol groups on the block copolymer permit further reactivity, i.e., a cure mechanism. Upon curing, the physical properties of solid compositions may be further altered, as discussed in certain embodiments below.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

In one embodiment, the solid compositions may be characterized by determining the onset of melt flow, as measured by where the "crossover" of G"/G' occurs in the respective rheological graphs. It has been found that this value does not change significantly with the superbase concentration in the compositions. For example, starting with a 45 wt % TPh copolymer coupled with a 140 dp PhMe polymer (see example 2 reference), the concentration of DBU in the compositions was increased in the series: 0, 17, 50, 100, 250 and 500 ppm resulting in the following values for G"/G' cross-over temperatures: 63, 87, 78, 91, 91, 86° C. While not wishing to be bound by any specific theory, it is believed that this cross-over temperature corresponds to the glass transitions of the Ph-T resin-rich phase in the block copolymer compositions. The importance of this glass transition is illustrated by the data summarized in Table 3 of the Examples. The data show very little cure reaction takes place at 80° C. While not wishing to be limited by any theory, it is believed that this may be attributed to the resin phase portion of the block copolymer acting as a self-encapsulated phase for the superbase catalyst. When the resin phase becomes mobile (during melt flow), the catalyst has the needed mobility to result in condensation cure.

In some embodiments, the solid curable compositions of the embodiments included herein may be also be characterized by determining the G'/G" cross-over temperature. This "crossover" temperature indicates the onset of condensation cure for the resin-linear copolymer. The present inventors have found G'/G" cross-over temperatures varies with superbase content (an in particular for DBU concentration). For example, for a 45 wt % Ph-T copolymer coupled with a 140 dp PhMe polymer (example 2), the DBU level was increased in the series: 0, 17, 50, 100, 250 and 500 ppm resulting in the following values for G'/G" cross-over temperatures: 183, 130, 138, 106, 100, 98° C. As the overlay in FIG. 1 illustrates, the cross-over temperature levels at approximately 100° C. Although not wishing to be bound by any theory, the present inventors believe this might again be related to the reduction in mobility of the resin-rich phase: silanol groups are present only on the resin and around 100° C. the temperature is very close to the $T_g$ of the resin phase. This will result in significant mobility reduction. Thus, the viscosity of the curable compositions containing the superbase catalyst at 120° C. may be higher than those without the superbase catalyst. This is illustrated by the representative examples shown in Table 2. Thus, in certain embodiments, the curable compositions have a viscosity of at least 1700 Pa·s at 120° C., alternatively at least 2000 Pa·s at 120° C., alternatively at least 5000 Pa·s at 120° C., alternatively at least 10,000 Pa·s at 120° C., alternatively at least 20,000 Pa·s at 120° C. or alternatively at least 30,000 Pa·s at 120° C. In other embodiments, the curable compositions have a viscosity of from about 1500 Pa·s at 120° C. to about 50,000 Pa·s at 120° C.; e.g., from about 1700 Pa·s at 120° C. to about 3000 Pa·s at 120° C.; about 2500 Pa·s at 120° C. to about 5000 Pa·s at 120° C.; from about 1500 Pa·s at 120° C. to about 2000 Pa·s at 120° C.; from about 1600 Pa·s at 120° C. to about 1800 Pa·s at 120° C., from about 10,000 Pa·s at 120° C. to about 40,000 Pa·s at 120° C., from about 20,000 Pa·s at 120° C. to about 40,000 Pa·s at 120° C. or from about 25,000 Pa·s at 120° C. to about 35,000 Pa·s at 120° C.

The addition of a superbase catalyst to the present resin-linear block copolymer compositions allows the cure temperature to be reduced from a temperature typically ranging from 120 to 250° C. without catalyst to a temperature range of 60° C. to 150° C. In one embodiment, the curable compositions of the embodiments described herein have a cure temperature that is 10%, alternatively 20%, or alternatively 50% less than the cure temperature of comparable compositions without the superb ase catalyst. In other embodiments, the curable compositions of the embodiments described herein have a cure temperature that is about 10% to about 50% lower; e.g., from about 20% to about 50% lower; from about 10% to about 20% lower; from about 25% to about 50% lower; or from about 15 to about 30% lower than the cure temperature of comparable compositions without the superbase catalyst.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

The present disclosure further provides a process for preparing a curable composition comprising:

I) reacting
  a) a linear organosiloxane having the formula

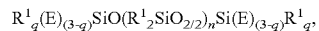

where each $R^1$ is independently a $C_1$ to $C_{30}$ hydrocarbyl,
  n is 10 to 400, q is 0, 1, or 2,
  E is a hydrolyzable group containing at least one carbon atom, and
  b) an organosiloxane resin comprising at least 60 mole % of $[R^2SiO_{3/2}]$siloxy units in its formula, where each $R^2$ is independently a $C_1$ to $C_{20}$ hydrocarbyl,
  in c) an organic solvent;
  to form a resin-linear organosiloxane block copolymer;
    wherein the amounts of a) and b) used in step I are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$, and
    wherein at least 95 weight percent of the linear organosiloxane added in step I is incorporated into the resin-linear organosiloxane block copolymer,
II) reacting the resin-linear organosiloxane block copolymer from step I) to crosslink the trisiloxy units of the resin-linear organosiloxane block copolymer sufficiently to increase the average molecular weight ($M_W$) of the resin-linear organosiloxane block copolymer by at least 50%;

III) adding to the resin-linear organosiloxane block copolymer from step II) a superbase catalyst; and IV) optionally, removing the organic solvent.

The Linear Organosiloxane

Component a) in step I of the present process is a linear organosiloxane having the formula $R^1{}_q(E)_{(3-q)}SiO(R^1{}_2SiO_{2/2})_nSi(E)_{(3-q)}R^1{}_q$, where each $R^1$ is independently a $C_1$ to $C_{30}$ hydrocarbyl, the subscript "n" may be considered as the degree of polymerization (dp) of the linear organosiloxane and may vary from 10 to 400, the subscript "q" may be 0, 1, or 2, and E is a hydrolyzable group containing at least one carbon atom. While component a) is described as a linear organosiloxane having the formula $R^1{}_q(E)_{(3-q)}SiO(R^1{}_2SiO_{2/2})_nSi(E)_{(3-q)}R^1{}_q$, one skilled in the art recognizes small amount of alternative siloxy units, such a T ($R^1SiO_{3/2}$) siloxy units, may be incorporated into the linear organosiloxane and still be used as component a). As such, the organosiloxane may be considered as being "predominately" linear by having a majority of D ($R^1{}_2SiO_{2/2}$) siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

$R^1$ in the above linear organosiloxane formula is independently a $C_1$ to $C_{30}$ hydrocarbyl. The hydrocarbon group may independently be an alkyl, aryl, or alkylaryl group. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

E may be selected from any hydrolyzable group containing at least one carbon atom. In some embodiments, E is selected from an oximo, epoxy, carboxy, amino, amido group or combinations thereof. Alternatively, E may have the formula $R^1C(=O)O-$, $R^1{}_2C=N-O-$, or $R^4C=N-O-$, where $R^1$ is as defined above, and $R^4$ is hydrocarbyl. In one embodiment, E is $H_3CC(=O)O-$ (acetoxy) and q is 1. In one embodiment, E is $(CH_3)(CH_3CH_2)C=N-O-$ (methylethylketoxy) and q is 1.

In one embodiment, the linear organosiloxane has the formula $(CH_3)_q(E)_{(3-q)}SiO[(CH_3)_2SiO_{2/2}]_nSi(E)_{(3-q)}(CH_3)_q$, where E, n, and q are as defined above.

In one embodiment, the linear organosiloxane has the formula $(CH_3)_q(E)_{(3-q)}SiO[(CH_3)(C_6H_5)SiO_{2/2}]_nSi(E)_{(3-q)}(CH_3)_q$, where E, n, and q are as defined above.

Processes for preparing linear organosiloxanes suitable as component a) are known. In some embodiments, a silanol terminated polydiorganosiloxane is reacted with an "endblocking" compound such as an alkyltriacetoxysilane or a dialkylketoxime. The stoichiometry of the endblocking reaction is typically adjusted such that a sufficient amount of the endblocking compound is added to react with all the silanol groups on the polydiorganosiloxane. Typically, a mole of the endblocking compound is used per mole of silanol on the polydiorganosiloxane. Alternatively, a slight molar excess such as 1 to 10% of the endblocking compound may be used.

The reaction is typically conducted under anhydrous conditions to minimize condensation reactions of the silanol polydiorganosiloxane. Typically, the silanol ended polydiorganosiloxane and the endblocking compound are dissolved in an organic solvent under anhydrous conditions, and allowed to react at room temperature, or at elevated temperatures (up to the boiling point of the solvent).

The Organosiloxane Resin

Component b) in the present process is an organosiloxane resin comprising at least 60 mole % of $[R^2SiO_{3/2}]$ siloxy units in its formula, where each $R^2$ is independently a $C_1$ to $C_{20}$ hydrocarbyl. The organosiloxane resin may contain any amount and combination of other M, D, and Q siloxy units, provided the organosiloxane resin contains at least 70 mole % of $[R^2SiO_{3/2}]$ siloxy units, alternatively the organosiloxane resin contains at least 80 mole % of $[R^2SiO_{3/2}]$ siloxy units, alternatively the organosiloxane resin contains at least 90 mole % of $[R^2SiO_{3/2}]$ siloxy units, or alternatively the organosiloxane resin contains at least 95 mole % of $[R^2SiO_{3/2}]$ siloxy units. In some embodiments, the organosiloxane resin contains from about 70 to about 100 mole % of $[R^2SiO_{3/2}]$ siloxy units, e.g., from about 70 to about 95 mole % of $[R^2SiO_{3/2}]$ siloxy units, from about 80 to about 95 mole % of $[R^2SiO_{3/2}]$ siloxy units or from about 90 to about 95 mole % of $[R^2SiO_{3/2}]$ siloxy units. Organosiloxane resins useful as component b) include those known as "silsesquioxane" resins.

Each $R^2$ is independently a $C_1$ to $C_{20}$ hydrocarbyl. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The weight average molecular weight ($M_W$) of the organosiloxane resin is not limiting, but, in some embodiments, ranges from 1000 to 10,000, or alternatively 1500 to 5000 g/mole.

One skilled in the art recognizes that organosiloxane resins containing such high amounts of $[R^2SiO_{3/2}]$ siloxy units will inherently have a certain concentration of Si—OZ where Z may be hydrogen (i.e., silanol), an alkyl group (so that OZ is an alkoxy group), or alternatively OZ may also be any of the "E" hydrolyzable groups as described above. The Si—OZ content as a mole percentage of all siloxy groups present on the organosiloxane resin may be readily determined by $^{29}Si$ NMR. The concentration of the OZ groups present on the organosiloxane resin will vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

Organosiloxane resins containing at least 60 mole % of $[R^2SiO_{3/2}]$ siloxy units, and methods for preparing them, are known in the art. They are typically prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step I. This may be achieved by dissolving the organosiloxane resin in an organic solvent, heating to reflux, and removing water by separation techniques (for example Dean Stark trap or equivalent process).

The amounts of a) and b) used in the reaction of step I are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$. The mole % of dilsiloxy and trisiloxy units present in components a) and b) may be readily determined using $^{29}Si$ NMR techniques. The starting mole % then determines the mass amounts of components a) and b) used in step I.

In some embodiments, the organosiloxane block copolymers comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

The amount of components a) and b) selected should also ensure there is a molar excess of the silanol groups on the organosiloxane resin vs. amount of linear organosiloxane added. Thus, a sufficient amount of the organosiloxane resin should be added to potentially react with all the linear organosiloxane added in step I). As such, a molar excess of the organosiloxane resin is used. The amounts used may be determined by accounting for the moles of the organosiloxane resin used per mole of the linear organosiloxane.

As discussed above, the reaction affected in step I is a condensation reaction between the hydrolyzable groups of linear organosiloxane with the silanol groups on the organosiloxane resin. A sufficient amount of silanol groups needs to remain on the resin component of the formed resin-linear organosiloxane copolymer to further react in step II of the present process. In some embodiments, at least 10 mole %, alternatively at least 20 mole %, or alternatively at least 30 mole % silanol should remain on the trisiloxy units of the resin-linear organosiloxane copolymer as produced in step I of the present process. In some embodiments, from about 10 mole % to about 60 mole %, e.g., from about 20 mole % to about 60 mole %, or from about 30 mole % to about 60 mole %, should remain on the trisiloxy units of the resin-linear organosiloxane copolymer as produced in step I of the present process.

The reaction conditions for reacting the aforementioned (a) linear organosiloxane with the (b) organosiloxane resin are not limited. In some embodiments, reaction conditions are selected to effect a condensation type reaction between the a) linear organosiloxane and b) organosiloxane resin. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. Typically, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. Typically, aromatic solvents such as toluene, xylene, benzene, and the like are utilized. The amount of the organosiloxane resin dissolved in the organic solvent may vary, but typically the amount should be selected to minimize the chain extension of the linear organosiloxane or pre-mature condensation of the organosiloxane resin.

The order of addition of components a) and b) may vary. In some embodiments, the linear organosiloxane is added to a solution of the organosiloxane resin dissolved in the organic solvent. This order of addition is believed to enhance the condensation of the hydrolyzable groups on the linear organosiloxane with the silanol groups on organosiloxane resin, while minimizing chain extension of the linear organosiloxane or pre-mature condensation of the organosiloxane resin. In other embodiments, the organosiloxane resin is added to a solution of the linear organosiloxane dissolved in the organic solvent.

The progress of the reaction in step I, and the formation of the resin-linear organosiloxane block copolymer, may be monitored by various analytical techniques, such as GPC, IR, or $^{29}Si$ NMR. Typically, the reaction in step I is allowed to continue until at least 95 weight percent (e.g., at least 96%, at least 97%, at least 98%, at least 99% or 100%) of the linear organosiloxane added in step I is incorporated into the resin-linear organosiloxane block copolymer.

The second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%. In some embodiments, the second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer from about 50% to about 100%, e.g., from about 60% to about 100%, from about 70% to about 100%, from about 80% to about 100% or from about 90% to about 100%, where a 100% increase in the molecular weight of the resin-linear organosiloxane block copolymer corresponds to the doubling of the molecular weight of the resin-linear organosiloxane block copolymer.

It is believed that reaction of step II crosslinks the trisiloxy blocks of the resin-linear organosiloxane block copolymer formed in step I, which will increase the average molecular weight of the block copolymer. The inventors also believe the crosslinking of the trisiloxy blocks provides the block copolymer with an aggregated concentration of trisiloxy blocks, which ultimately may help to form "nano-domains" in solid compositions of the block copolymer. In other words, this aggregated concentration of trisiloxy blocks may phase separate when the block copolymer is isolated in a solid form such as a film or cured coating. The aggregated concentration of trisiloxy block within the block copolymer and subsequent formation of "nano-domains" in the solid compositions containing the block copolymer, may provide for enhanced optical clarity of these compositions as well as the other physical property benefits associated with these materials.

The crosslinking reaction in Step II may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin in step I of the preparation of the block copolymer. The free resin component may crosslink with the non-linear blocks by condensation of the residual silanol groups present on the non-linear blocks and on the free resin. The free resin may provide crosslinking by reacting with lower molecular weight compounds added as crosslinkers, as described below.

Step II of the present process may occur simultaneous upon formation of the resin-linear organosiloxane of step I, or involve a separate reaction in which conditions have been modified to affect the step II reaction. The step II reaction may occur in the same conditions as step I. In this situation, the step II reaction proceeds as the resin-linear organosiloxane copolymer is formed. Alternatively, the reaction conditions used for step I) are extended to further the step II reaction. Alternatively, the reaction conditions may be changed, or additional ingredients added to affect the step II reaction.

In some embodiments, the step II reaction conditions may depend on the selection of the hydrolyzable group (E) used in the starting linear organosiloxane. When (E) in the linear organosiloxane is an oxime group, it is possible for the step II reaction to occur under the same reaction conditions as step I. That is, as the linear-resin organosiloxane copolymer is formed in step I, it will continue to react via condensation of the silanol groups present on the resin component to further increase the molecular weight of the resin-linear organosiloxane copolymer. Not wishing to be bound by any theory, it is believed that when (E) is an oximo group, the hydrolyzed oximo group (for example methyl ethylketoxime) resulting from the reaction in step I may act as a condensation catalyst for the step II reaction. As such, the step II reaction may proceed simultaneously under the same conditions for step I. In other words, as the resin-linear organosiloxane copolymer is formed in step I, it may further react under the same reaction conditions to further increase its molecular weight via a condensation reaction of the silanol groups present on the resin component of the copolymer. However, when (E) on the linear organosiloxane is an acetoxy group, the resulting hydrolyzed group (acetic acid), does not sufficiently catalyze the step II) reaction. Thus, in this situation the step II reaction may be enhanced with a further component to affect condensation of the resin components of the resin-linear organosiloxane copolymer, as described in the embodiment below.

In one embodiment of the present process, an organosilane having the formula $R^5_q SiX_{4-q}$ is added during step II), where $R^5$ is a $C_1$ to $C_8$ hydrocarbyl or a $C_1$ to $C_8$ halogen-substituted hydrocarbyl, X is a hydrolyzable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be E, as defined above, a halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in this embodiment include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime)silane.

The amount of organosilane having the formula $R^5_q SiX_{4-q}$ when added during step II) varies, but should be based on the amount of organosiloxane resin used in the process. The amount of silane used should provide a molar stoichiometry of 2 to 15 mole % of organosilane per moles of Si on the organosiloxane resin. Furthermore, the amount of the organosilane having the formula $R^5_q SiX_{4-q}$ added during step II) is controlled to ensure a stoichiometry that does not consume all the silanol groups on the organosiloxane block copolymer. In one embodiment, the amount of the organosilane added in step II is selected to provide an organosiloxane block copolymer containing 0.5 to 35 mole percent of silanol groups [≡SiOH].

Step III in the present process involves adding to the resin-linear organosiloxane block copolymer from step II) a superbase catalyst. The superbase catalyst and amounts used in step III are the same as described above.

Step IV of the present process is optional, and involves removing the organic solvent used in the reactions of steps I and II. The organic solvent may be removed by any known techniques, but typically involves heating the resin-linear organosiloxane copolymer compositions at elevated temperature, either at atmospheric conditions or under reduced pressures. In some embodiments, not all of the solvent is removed. In this embodiment, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

The present disclosure further provides a method of improving at least one of the following properties; cure, tensile strength, or thermal stability, of a solid curable film composition of a resin linear organopolysiloxane of the embodiments described herein by adding to the composition a superbase catalyst. The solid curable film compositions of a resin-linear organopolysiloxane of the embodiments described herein and the superbase catalyst are the same as defined above.

The improvements in cure properties may be characterized by the reduction in cure temperatures necessary to initiate final cure of the present compositions. In some embodiments, this may be assessed by determining the G'/G" cross-over temperature from the rheological assessment, as discussed above. The addition of a superbase catalyst to the present resin-linear block copolymer compositions allows the cure temperature to be reduced from a temperature typically ranging from 120 to 250° C. without catalyst to a temperature range of 60° C. to 150° C. In one embodiment, the temperature needed to cure the present curable composition is reduced by 10%, alternatively 20%, or alternatively 50% by the addition of a superbase catalyst vs. comparable compositions without the superbase catalyst. In other embodiments, the curable compositions of the embodiments described herein have a cure temperature that is about 10% to about 50% lower; e.g., from about 20% to about 50% lower; from about 10% to about 20% lower; from about 25% to about 50% lower; or from about 15 to about 30% lower than the cure temperature of comparable compositions without the superbase catalyst.

The improvement in tensile strength may be characterized by at least a 50% increase, alternatively at least a 75%, or alternatively at least 100% increase in tensile strength for those compositions containing the superbase catalyst vs. those not containing a superbase catalyst. In some embodiments, the improvement in tensile strength may be from about 50% to about 100% increase in tensile strength, e.g., from about 50% to about 75%, from about 60% to about 90%, about 60% to about 100% or from about 75% to about 100% increase in tensile strength.

The improvement in thermal stability may be characterized either qualitatively or quantitatively. For example, the improvements in thermal stability may be assessed qualitatively by visually assessing the change in color of the heat aged cured films (for example color assessment after aging 100 h at 250° C.). Films prepared from the present curable compositions containing the superbase may have less color than comparable compositions without the superbase catalyst. In some embodiments, the films prepared from the curable compositions containing a superbase have an optical transmittance of visible light of at least 95%, e.g., at least 96%; at least 97%; at least 98%; at least 99%; or 100% transmittance of visible light. As used herein, the term "visible light" includes light with wavelengths above 350 nm. Alternatively, thermal stability may be assessed quantitatively by techniques such as by determining the temperature ($T_d$) at which a 5 wt % loss occurs during heating at 5° C./min (see examples for more details).

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt. %. All measurements were conducted at 23° C. unless indicated otherwise.

Characterization Techniques $^{29}$Si and $^{13}$C NMR Spectrometry

NMR samples of resin linear products were prepared by weighing ~3 grams of solvent free resin linear (prepared by drying sample overnight at room temperature), 1 g of CDCl$_3$, and 4 grams of 0.04 M Cr(acac)$_3$ solution in CDCl$_3$ into a vial and mixing thoroughly. Samples were then transferred into a silicon-free NMR tube. Spectra were acquired using a Varian Mercury 400 MHz NMR. NMR samples of other materials such as 217 Flake and silanol terminated PDMS were prepared by diluting 4 g of sample into 4 grams of 0.04 M Cr(acac)$_3$ solution in CDCl$_3$.

$^{13}$C NMR experiments were performed in the following manner. Samples were placed into 16 mm glass NMR tubes. A 5 mm NMR tube was placed inside the 16 mm tube and filled with lock solvent. 13C DEPT NMR was acquired in 12 or 20 minute signal averaging blocks. Data was acquired on a Varian Inova NMR spectrometer with a 1H operational frequency of 400 MHz.

Silanol content of resin linear products was calculated from the integration values of the T(Ph,OZ) and T(Ph,OZ2) regions in the $^{29}$Si NMR spectrum. T(Alkyl) groups were considered fully condensed (assumption) and subtracted from the T(Ph,OZ) region. The T(Alkyl) content was calculated by multiplying the integration value of D(Me$_2$) from $^{29}$Si NMR by the fraction (moles Si of coupling agent/moles Si of PDMS used in the synthesis formulation). Isopropoxy from 217 Flake was not subtracted out of the OZ values due to its low concentration. Therefore it was assumed that total OZ=total OH.

GPC Analysis

Samples were prepared in certified THF at 0.5% w/v concentration, filtered with a 0.45 μm PTFE syringe filter, and analyzed against polystyrene standards. The relative calibration ($3^{rd}$ order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 100 μL and columns and detector were heated to 35° C. Data collection was 25 minutes and processing was performed using Atlas/Cirrus software.

To determine free resin content, the free resin peak at lower molecular weight was integrated to get the area percent.

Rheology Analysis

A commercially available rheometer from TA Instruments (ARES-RDA with 2KSTD standard flexular pivot spring transducer, TA Instruments, New Castle, Del. 19720) with forced convection oven was used to measure the storage modulus (G'), loss modulus (G") and tan delta as a function of temperature. Test specimens (typically 8 mm wide, 1 mm thick) were loaded in between parallel plates and measured using small strain oscillatory rheology while ramping the temperature in a range from 25° C. to 300° C. at 2° C./min (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection temperature in the G' rise (labeled CURE).

Optical Clarity

Optical clarity was evaluated as the % transmission of light at wavelengths from about 350-1000 nanometers, measured through 1 mm thick samples of cast sheets of the present compositions. Samples having a % transmittance of at least 95% were considered to be optically clear.

Example 1 (Reference)

PhMe Resin Linear Using 47 dp Diacetoxy Terminated PhMe Siloxane Composition: $(PhMeSiO_{2/2})_{0.52}$ $(PhSiO_{3/2})_{0.41}$ (45 wt % Phenyl-T)

A 500 mL 4 neck round bottom flask was loaded with Dow Corning 217 Flake (45.0 g, 0.329 moles Si) and toluene (Fisher Scientific, 70.38 g). The flask was equipped with a thermometer, Teflon stir paddle, and a Dean Stark apparatus attached to a water-cooled condenser. A nitrogen blanket was applied, Dean Stark was prefilled with toluene, and an oil bath was used for heating. The reaction mixture was heated at reflux for 30 min. After cooling the reaction mixture to 108° C., a solution of diacetoxy terminated PhMe siloxane was added quickly. The diacetoxy terminated PhMe siloxane was prepared by adding a 50/50 wt % methyl triacetoxy silane (MTA)/ethyl triacetoxy silane (ETA) (3.34 g, 0.0144 moles Si) mixture to a solution of 47 dp silanol terminated PhMe siloxane (55.0 g, 0.403 moles Si) dissolved in toluene (29.62 g). The solution was mixed for 2 hrs at room temperature under a nitrogen atmosphere. After the diacetoxy terminated PhMe siloxane was added, the reaction mixture was heated at reflux for 2 hrs. At this stage 50/50 wt % MTA/ETA (6.94 g, 0.0300 moles Si) was added at 108° C. The reaction mixture was heated at reflux for an additional 1 hr. It was cooled to 90° C. and then DI water (15 mL) was added. Temperature was increased to reflux and the water was removed by azeotropic distillation. Reaction mixture was cooled again to 90° C. and more DI water (15 mL) was added. It was heated up to reflux and water was removed again. Some toluene (56.4 g) was then removed by distillation to increase the solids content. Material was cooled to room temperature and then pressure filtered through a 5.0 μm filter. Cast sheets (made by pouring the solution in a chase and evaporating the solvent) were optically clear.

Example 2 (Reference)

PhMe Resin Linear Using 140 dp Diacetoxy Terminated PhMe Siloxane Composition: $(PhMeSiO_{2/2})_{0.52}$ $(PhSiO_{3/2})_{0.42}$ (45 wt % Phenyl-T)

A 500 mL 4 neck round bottom flask was loaded with Dow Corning 217 Flake (45.0 g, 0.329 moles Si) and toluene (Fisher Scientific, 70.38 g). The flask was equipped with a thermometer, Teflon stir paddle, and a Dean Stark apparatus attached to a water-cooled condenser. A nitrogen blanket was applied, Dean Stark was prefilled with toluene, and an oil bath was used for heating. The reaction mixture was heated at reflux for 30 min. After cooling the reaction mixture to 108° C., a solution of diacetoxy terminated PhMe siloxane was added quickly. The diacetoxy terminated PhMe siloxane was prepared by adding a 50/50 wt % MTA/ETA (1.21 g, 0.00523 moles Si) mixture to a solution of 140 dp silanol terminated PhMe siloxane (55.0 g, 0.404 moles Si) dissolved in toluene (29.62 g). The solution was mixed for 2 hrs at room temperature under a nitrogen atmosphere. After the diacetoxy terminated PhMe siloxane was added, the reaction mixture was heated at reflux for 2 hrs. At this stage 50/50 wt % MTA/ETA (7.99 g, 0.0346 moles Si) was added at 108° C. The reaction mixture was heated at reflux for an additional 1 hr. It was cooled to 90° C. and then DI water (12 mL) was added. Temperature was increased to reflux and the water was removed by azeotropic distillation. Reaction mixture was cooled again to 90° C. and more DI water (12 mL) was added. It was heated up to reflux and water was removed again. Some toluene (56.9 g) was then removed by distillation to increase the solids content. Material was cooled to room temperature and then pressure filtered through a 5.0 μm filter. Cast sheets (made by pouring the solution in a chase and evaporating the solvent) were optically clear.

Example 3 (Reference)

PhMe Resin Linear Using 230 dp Diacetoxy Terminated PhMe Siloxane Composition: $(PhMeSiO_{2/2})_{0.53}$ $(PhSiO_{3/2})_{0.41}$ (45 wt % Phenyl-T)

A 500 mL 4 neck round bottom flask was loaded with Dow Corning 217 Flake (45.0 g, 0.329 moles Si) and toluene (Fisher Scientific, 70.38 g). The flask was equipped with a thermometer, Teflon stir paddle, and a Dean Stark apparatus attached to a water-cooled condenser. A nitrogen blanket was applied, Dean Stark was prefilled with toluene, and an oil bath was used for heating. The reaction mixture was heated at reflux for 30 min. After cooling the reaction mixture to 108° C., a solution of diacetoxy terminated PhMe siloxane was added quickly. The diacetoxy terminated PhMe siloxane was prepared by adding a 50/50 wt % MTA/ETA (0.82 g, 0.00355 moles Si) mixture to a solution of 230 dp silanol terminated PhMe siloxane (55.0 g, 0.404 moles Si) dissolved in toluene (29.62 g). The solution was mixed for 2 hrs at room temperature under a nitrogen atmosphere. After the diacetoxy terminated PhMe siloxane was added, the reaction mixture was heated at reflux for 2 hrs. At this stage 50/50 wt % MTA/ETA (9.89 g, 0.0428 moles Si) was added at 108° C. The reaction mixture was heated at reflux for an additional 1 hr. It was cooled to 90° C. and then DI water (15 mL) was added. Temperature was increased to reflux and the water was removed by azeotropic distillation. Reaction mixture was cooled again to 90° C. and more DI water (15 mL) was added. It was heated up to reflux and water was removed again. Some toluene (57.0 g) was then removed by distillation to increase the solids content. Material was cooled to room temperature and then pressure filtered through a 5.0 μm filter. Cast sheets (made by pouring the solution in a chase and evaporating the solvent) were optically clear.

Example 4 (Reference)

PhMe Resin Linear Using 140 dp Diacetoxy Terminated PhMe Siloxane Composition: (PhMeSiO$_{2/2}$)$_{0.64}$ (PhSiO$_{3/2}$)$_{0.32}$ (35 wt % Phenyl-T)

A 500 mL 4 neck round bottom flask was loaded with Dow Corning 217 Flake (35.0 g, 0.256 moles Si) and toluene (Fisher Scientific, 65.0 g). The flask was equipped with a thermometer, Teflon stir paddle, and a Dean Stark apparatus attached to a water-cooled condenser. A nitrogen blanket was applied, Dean Stark was prefilled with toluene, and an oil bath was used for heating. The reaction mixture was heated at reflux for 30 min. After cooling the reaction mixture to 108° C., a solution of diacetoxy terminated PhMe siloxane was added quickly. The diacetoxy terminated PhMe siloxane was prepared by adding a 50/50 wt % MTA/ETA (1.44 g, 0.00623 moles Si) mixture to a solution of 140 dp silanol terminated PhMe siloxane (65.0 g, 0.477 moles Si) dissolved in toluene (35.0 g). The solution was mixed for 2 hrs at room temperature under a nitrogen atmosphere. After the diacetoxy terminated PhMe siloxane was added, the reaction mixture was heated at reflux for 2 hrs. At this stage 50/50 wt % MTA/ETA (6.21 g, 0.0269 moles Si) was added at 108° C. The reaction mixture was heated at reflux for an additional 1 hr. It was cooled to 90° C. and then DI water (12 mL) was added. Temperature was increased to reflux and the water was removed by azeotropic distillation. Reaction mixture was cooled again to 90° C. and more DI water (12 mL) was added. It was heated up to reflux and water was removed again. Some toluene (54.0 g) was then removed by distillation to increase the solids content. Material was cooled to room temperature and then pressure filtered through a 5.0 μm filter. Cast sheets (made by pouring the solution in a chase and evaporating the solvent) were optically clear.

Examples 5-12

DBU (1,8-Diazabicyclo[5.4.0]undec-7-ene, from Aldrich) was diluted with toluene to a 0.1% dilution level. This toluene solution was added to an approximately 70% solids solution of the resin-linears in toluene to reach the targeted catalyst levels.

TABLE 1

Resin-linears with and without catalysts

| Example | Resin Linear copolymer Example # | ppm DBU |
|---|---|---|
| 5 | 1 | 50 |
| 6 | 3 | 50 |
| 7 | 4 | 50 |
| 8 | 2 | 17 |
| 9 | 2 | 50 |
| 10 | 2 | 100 |
| 11 | 2 | 250 |
| 12 | 2 | 500 |

Procedure to Prepare Uncured Films and Samples for Rheology to Measure Flow and Cure Rate:

1. Cast films on a fluorinated release film (2 mil) using a 4" draw down bar set at approximately 8 mil
2. Evaporate toluene for 20 min at 60° C. on a hot plate
3. Fold film onto itself and cold press to achieve thickness required for a parallel plate rheology experiment (about 1 mm)
4. Set the rheometer at the desired temperature (80° C. to 160° C.) and place the 8 mm diameter sample between the plates
5. Start the experiments within 10 s The catalytic activity for the DBU superbase in several resin-linear block copolymer compositions is summarized in Table 2 below. The G"/G' cross-over shows the onset of melt flow for the resin-linear copolymer. This value did not change significantly with DBU level. For example, for a 45 wt % Ph-T copolymer coupled with a 140 dp PhMe polymer (Example 2), the DBU level was increased in the series: 0, 17, 50, 100, 250 and 500 ppm resulting in the following values for G"/G' cross-over temperatures: 63, 87, 78, 91, 91, 86° C. This cross-over corresponds to the glass transitions of the Ph-T resin-rich phase. The importance of this glass transition is in Table 3, showing that at 80° C. very little cure reaction takes place. This can be attributed to the fact that the resin phase acts as a self-encapsulated phase for the catalyst. When the resin phase becomes mobile, the catalyst has the needed mobility to result in condensation cure.

The G'/G" cross-over temperature indicates the onset of condensation cure for the resin-linear copolymer. This value changes much more dramatically with DBU content. For example, for a 45 wt % Ph-T copolymer coupled with a 140 dp PhMe polymer (Example 2), the DBU level was increased in the series: 0, 17, 50, 100, 250 and 500 ppm resulting in the following values for G'/G" cross-over temperatures: 183, 130, 138, 106, 100, 98° C. This data is further summarized in FIG. 1, which shows the cross-over temperature levels of around 100° C. This might again be related to the reduction in mobility of the resin-rich phase: silanol groups are present only on the resin and around 100° C. the temperature is very close to the $T_g$ of the resin phase. This will result in significant mobility reduction. Viscosity at 120° C. was also measured, and summarized in Table 2. The results show a much higher viscosities was obtained for increasing DBU levels, resulting from the accelerated cure behavior.

TABLE 2

Uncured Resin-linear films with and without DBU catalyst: flow characteristics; cure characteristics (from non-iso rheology)

| Ex. # | wt % Ph-T | dp PhMe | DBU level, ppm | G''/G' cross flow T, °C. | viscosity at 120° C., Pa·s | G'/G" cross cure T, °C. |
|---|---|---|---|---|---|---|
| 1 | 45 | 47 | 0 | 30 | 42 | 139 |
| 2 | 45 | 140 | 0 | 63 | 93 | 183 |
| 3 | 45 | 230 | 0 | 86 | 1641 | 158 |
| 4 | 35 | 140 | 0 | 48 | 72 | 179 |
| 5 | 45 | 47 | 50 | 41 | 2464 | 96 |
| 6 | 45 | 230 | 50 | not measured | not measured | not measured |
| 7 | 35 | 140 | 50 | 57 | 2961 | 100 |
| 8 | 45 | 140 | 17 | 87 | 1793 | 130 |
| 9 | 45 | 140 | 50 | 78 | 3264 | 138 |
| 10 | 45 | 140 | 100 | 91* | 33,318 | 106** |
| 11 | 45 | 140 | 250 | 91* | 83,130 | 100** |
| 12 | 45 | 140 | 500 | 86* | 167,000 | 98** |

*inflection point in G' taken instead, no cross-over occurs (G' always >G")
**minimum in G' taken, no cross-over occurs (G' always >G")

Figure 2:
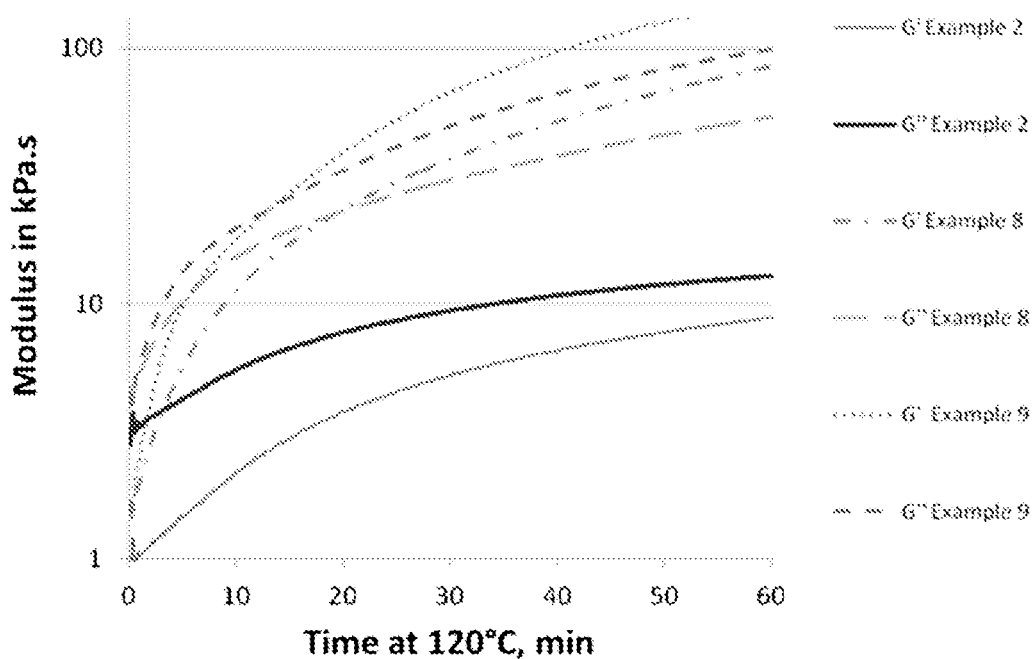
FIG. 2 is an isothermal cure plot, where the cure is measured using oscillatory rheology, where the storage modulus (G') and the loss modulus (G") are plotted as a function of time at 120° C.

The cure rates in isothermal conditions for several of the above examples are summarized in FIG. 2 and Table 3. The results indicate higher DBU levels result in earlier gelation points (G'/G" cross-over time), higher viscosity increase and higher storage modulus after certain reaction times (G' after 1 h at the isothermal temperature of interest). The point where G' crosses over G" (G'/G" cross-over) is the gel point, also reported in Table 3 below.

TABLE 3

Uncured Resin-linear films with and without DBU catalyst: flow characteristics, cure characteristics (from iso rheology); G'/G" cross time corresponds to tan delta = 1

| Example # | DBU level, ppm | Temperature, °C. (T) | G'/G" cross, t in min | $\Delta\eta^*/\eta^*$ 1 h [1] | G' after 1 h, kPa at T |
|---|---|---|---|---|---|
| 2 | 0 | 120 | >180 | 5.4 | 8.8 |
| 8 | 17 | 120 | 19 | 39 | 133 |
| 9 | 50 | 120 | 13 | 40 | 156 |
| 8 | 17 | 80 | >180 | 0.6 | 85 |
| 8 | 17 | 100 | 89 | 1.3 | 33 |
| 8 | 17 | 140 | 6 | 369 | 180 |
| 8 | 17 | 160 | 2 | 474 | 107 |

[1] $\Delta\eta^*/\eta^*_0$ is defined as the change in viscosity $(\eta^* - \eta^*_0)$ divided by the initial viscosity of the copolymer melt $\eta^*_0$. Note that * simply means that the viscosity was obtained using an oscillatory rheology experiment which measures the magnitude of the complex viscosity Besides accelerated cure, the addition of DBU superbase also increased tensile strength, improved thermal stability and, reduced color of the compositions after high temperature exposure in an oxidative environment, as summarized in Table 4.

TABLE 4

Cured Resin-linear films with and without DBU catalyst: tensile strength at break, thermal stability (Td 5%: temperature at 5 wt % loss during heating at 5° C./min), color after 100 h at 250° C.; all samples were cast as 1-1.5 mm thick sheets overnight at 25° C., placed in an oven and heated to 50° C. for 5 h, 70° C. for 5 h, 120° C. for 1 h and 160° C. for 3 h

| Example # | Ph-T wt % | dp PhMe | DBU level, ppm | Tensile strength at break, MPa | $T_d$ 5%, °C. | Color after 100 h at 250° C. |
|---|---|---|---|---|---|---|
| 1 | 45 | 47 | 0 | not measured | | |
| 2 | 45 | 140 | 0 | 3.5 | 304 | medium |
| 3 | 45 | 230 | 0 | 3.3 | | |
| 4 | 35 | 140 | 0 | not measured | | |
| 5 | 45 | 47 | 50 | 6.1 | 340 | |
| 6 | 45 | 230 | 50 | 8.4 | 378 | |
| 7 | 35 | 140 | 50 | 6.7 | 325 | |
| 9 | 45 | 140 | 50 | 6.3 | 360 | low |

Examples 13-15

PhMe Resin Linear Using 117 dp Diacetoxy Terminated PhMe Siloxane Composition: $(PhMeSiO_{2/2})_{0.54}$ $(PhSiO_{3/2})_{0.40}$ (45 wt % Phenyl-T)

A 5 L 4 neck round bottom flask was loaded with toluene (1196.53 g) and 217 flake phenyl-T resin (765.0 g, 5.60 moles Si). The flask was equipped with a thermometer, teflon stir paddle, and a Dean Stark apparatus attached to a water-cooled condenser. A nitrogen blanket was applied. The Dean Stark apparatus was pre-filled with toluene, and a heating mantle was used for heating. The reaction mixture was heated to reflux for 30 minutes, with the removal of 3.7 mL of water. The reaction mixture was then cooled to 108° C. (pot temperature).

A toluene solution of silanol terminated PhMe siloxane (1438.5 g solution; 935.0 g siloxane, 6.85 moles Si) was capped with 50/50 MTA/ETA (22.96 g, 0.0993 moles Si) in a glove box (same day) under nitrogen by adding 50/50 MTA/ETA to the siloxane and mixing at room temperature for 2 hours. The siloxane solution was added to the 217 flake solution quickly at 108° C. The reaction mixture was heated at reflux for 2 hrs, with a removal of 6.1 mL of water. The reaction mixture was again cooled to 108° C. At this stage 50/50 wt % MTA/ETA (135.95 g, 0.588 moles). The reaction mixture was heated at reflux for 1 hr, with the removal of 0.48 mL of water.

Repeated the following process two times:

The reaction mixture was cooled to 90° C. and then added DI water (204 mL). The reaction mixture was heated to reflux and the water was removed via azeotropic distillation. Each cycle lasted 1 hour, 40 minutes. The reaction mixture was left overnight at room temperature in between washes. The total amount of aqueous phase removed: 484.0 g.

A portion of the toluene (1004 g, along with the majority of remaining acetic acid) was removed to increase the solids content over a 55 minute period. DBU was diluted with toluene to a 0.1% dilution level. This toluene solution was added to an approximately 70% solids solution of the resin-linears in toluene to reach the catalyst levels shown in Tables 5 and 6, below. The reaction mixture was cooled to room temperature and pressure filtered through a 5.0 μm filter.

The cured and uncured films generated using the compositions made in this Example were transparent. All samples were cast as approximately 1 mm thick sheets overnight at 25° C., placed in an oven and heated to 50° C. for 5 h, 70° C. for 5 h, 120° C. for 1 h, and 160° C. for 3 h.

TABLE 5

Cured Resin-linear films with and without DBU catalyst based on Example 13 (45 wt % Ph-T, 117 dp of PhMe linear): mechanical properties before and after 1000 h at 225° C.;

| | | Cured sheets | | | 1000 h at 225° C. | | |
|---|---|---|---|---|---|---|---|
| Example # | DBU level, ppm | Tensile strength at break, MPa | Elongation at break, % | Shore D hardness | Tensile strength at break, MPa | Elongation at break, % | Shore D hardness |
| 13 | 0 | 2.7 | 78 | 40 | 5.4 | 36 | 56 |
| 14 | 17 | 3.8 | 80 | 40 | 4.8 | 23 | 54 |
| 15 | 50 | 4.1 | 65 | 42 | 4.7 | 19 | 58 |

TABLE 6

Cured Resin-linear films with and without DBU catalyst based on example 13 (45 wt % Ph-T, 117 dp of PhMe linear): optical properties measured using spectrophotometry after different times at 225° C.; all samples were cast as approximately 0.8 mm thick sheets overnight at 25° C., placed in an oven and heated to 50° C. for 5 h, 70° C. for 5 h, 120° C. for 1 h and 160° C. for 3 h

| Example # | DBU level, ppm | % Transmission at 447 nm after different times at 225° C. (forced air oven) | | |
|---|---|---|---|---|
| | | 0 hours | 500 hours | 1000 hours |
| 13 | 0 | 99.9 | 94.6 | 91.7 |
| 14 | 17 | 99.5 | 97.2 | 94.6 |
| 15 | 50 | 99.6 | 96.7 | 95.1 |

The invention claimed is:

1. A curable solid film composition comprising:
  i) an organosiloxane block copolymer comprising:
    40 to 90 mole percent disiloxy units of the formula [$R^1_2SiO_{2/2}$],
    10 to 60 mole percent trisiloxy units of the formula [$R^2SiO_{3/2}$],
    0.5 to 35 mole percent silanol groups [$\equiv$SiOH];
  wherein:
    $R^1$ is independently a $C_1$ to $C_{30}$ hydrocarbyl,
    $R^2$ is independently a $C_1$ to $C_{20}$ hydrocarbyl;
  wherein:
    the disiloxy units [$R^1_2SiO_{2/2}$] are arranged in linear blocks having an average of from 10 to 400 disiloxy units [$R^1_2SiO_{2/2}$] per linear block,
    the trisiloxy units [$R^2SiO_{3/2}$] are arranged in non-linear blocks having a molecular weight of at least 500 g/mole, and about 30% to about 80% of the non-linear blocks are crosslinked with each other, each linear block is linked to at least one non-linear block, and the non-linear blocks are predominately aggregated together in nano-domains; and
    the organosiloxane block copolymer has a weight average molecular weight ($M_W$) of at least 20,000 g/mole; and
  ii) a base selected from the group consisting of:
    1,8-Diazabicyclo [5.4.0]undec-7-ene(DBU),
    1,5,7-Triazabicyclo [4.4.0]dec-5-ene(TBD),
    1,4-Diazabicyclo [2.2.2]octane(DABCO),
    1,1,3,3-Tetramethylguanidine(TMG),
    1,5-Diazabicyclo [4.3.0]-5-nonene(DBN),
    7-Methyl-1,5,7-triazabicyclo[4.4.0]dec-5-ene(MTBD) and combinations thereof;
  wherein the curable solid film composition has an optical transmittance of at least 95 %.

2. The curable composition of claim 1, wherein the base is 1,8-Diazabicyclo [5.4.0]undec-7-ene.

3. The curable composition of claim 1, wherein $R^2$ is phenyl.

4. The curable composition of claim 1, wherein $R^1$ is methyl or phenyl.

5. The curable composition of claim 1, wherein the disiloxy units have the formula [$(CH_3)(C_6H_5)SiO_{2/2}$].

6. The curable composition of claim 1, wherein the disiloxy units have the formula [$(CH_3)_2SiO_{2/2}$].

7. The curable composition of claim 1, wherein the superbase is a silanol condensation enhancing agent.

8. The cured product of the curable solid film composition of claim 1.

9. The solid film composition of claim 1, wherein the composition has a storage modulus (G') at 120° C. ranging from 10 Pa to 1,000,000 Pa and a loss modulus (G") at 120° C. ranging from 10 Pa to 1,000,000 Pa.

10. The solid film composition of claim 1, wherein the film has a viscosity of at least 1700 Pa·s at 120° C.

11. The solid film composition of claim 1, wherein the film has a tensile strength of at least 1.0 MPa.

* * * * *